United States Patent
Braceras et al.

(10) Patent No.: US 7,613,050 B2
(45) Date of Patent: Nov. 3, 2009

(54) SENSE-AMPLIFIER ASSIST (SAA) WITH POWER-REDUCTION TECHNIQUE

(75) Inventors: George Maria Braceras, Essex Junction, VT (US); Harold Pilo, Underhill, VT (US); Fred John Towler, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 11/764,237

(22) Filed: Jun. 18, 2007

(65) Prior Publication Data

US 2008/0031063 A1   Feb. 7, 2008

Related U.S. Application Data

(63) Continuation-in-part of application No. 11/424,072, filed on Jun. 14, 2006.

(51) Int. Cl.
G11C 7/06 (2006.01)
G11C 8/00 (2006.01)
H01L 29/00 (2006.01)

(52) U.S. Cl. ............ 365/189.07; 365/233; 365/230.06; 365/154; 365/156; 257/E27.098

(58) Field of Classification Search ............ 365/189.07, 365/233, 230.06, 154, 156; 257/E27.098
See application file for complete search history.

(56) References Cited

U.S. PATENT DOCUMENTS

| | | | |
|---|---|---|---|
| 5,572,482 A * | 11/1996 | Hoshizaki et al. | 365/233.11 |
| 6,074,899 A | 6/2000 | Voldman | |
| 6,110,824 A | 8/2000 | Lecata et al. | |
| 6,127,264 A | 10/2000 | Bandyopadhyay et al. | |
| 6,498,385 B1 | 12/2002 | Daubenspeck et al. | |
| 6,764,919 B2 | 7/2004 | Yu et al. | |
| 6,804,153 B2 * | 10/2004 | Yoshizawa et al. | 365/189.15 |
| 2004/0222529 A1 | 11/2004 | Dostalik et al. | |

* cited by examiner

*Primary Examiner*—Howard Weiss
*Assistant Examiner*—Steven H Rao
(74) *Attorney, Agent, or Firm*—Connolly Bove Lodge & Hutz LLP; W. Riyon Harding

(57) ABSTRACT

A design structure comprising an apparatus which reduces the power in memory devices in general and, in particular, static random access memory (SRAM) arrays featuring sense amplifier assist (SAA) circuitry. The design structure limits the implementation of the SAA circuitry to SRAM array blocks that do not meet the application voltage requirements.

4 Claims, 11 Drawing Sheets

SENSE-AMPLIFIER ASSIST (SAA) WITH POWER-REDUCTION TECHNIQUE

CROSS REFERENCES TO RELATED APPLICATIONS

This Application is a continuation in part of U.S. application Ser. No. 11/424,072 filed Jun. 14, 2006, which is assigned to the present assignee.

FIELD OF THE INVENTION

This invention generally relates to a static random access memory (SRAM), and more particularly to a method for power reduction in such devices that utilize sense-amplifier assist (SAA) circuitry.

BACKGROUND OF THE INVENTION

A constant goal for the semiconductor industry is to continuously reduce the operating voltage and power required in semiconductor devices. The present invention is directed toward achieving this goal in SRAM arrays.

SRAM or other conventional memory devices are typically included in electronic systems for data storage. These memory devices store data in arrays of memory cells. Each cell conventionally stores a single bit of data (either a "1" or a "0") and can be individually accessed or addressed. Data is output from a memory cell during a READ operation, and data is stored into a memory cell during a WRITE operation.

In a READ or WRITE operation, a column decoder and a row decoder translate address signals into a single intersection of a row or word-line and column or bit-line within the memory array. This function permits the memory cell at that location to READ data from or WRITE data to the memory cell. The processing of data is dependent on the time it takes to store or retrieve individual bits of data in the memory cells.

FIG. 1 is an exemplary block diagram of a background art SRAM subarray with a sense amplifier. In particular, FIG. 1 shows signals RBS0 and RBS1 control the selection of one of two columns that share sense-amplifier circuitry. FIG. 1 also shows the signal BLR, which controls the Bit-line BL pre-charge PFETs T0, T2, T3, T4 that are normally unselected during the READ or WRITE operations.

Further, FIG. 1 shows the signal SUBSEL which enables the selected subarray that share global bit-line signals GBLT, GBLC signals with other subarrays. The SUBSEL signal transitions to $V_{DD}$ for the selected subarray. Unselected subarrays have their own unique SUBSEL signals at ground GND.

Further, in the background art schematic diagram shown in FIG. 1, selected columns have their bit-lines BLT0, BLC0 or BLT1, BLC1 coupled to the data lines DLC, DLT through selected bit switch devices T5-T8 and T12-T15. The columns selected by SUBSEL will see full signal amplification when the sense-amplifier circuit is enabled. However, in the background art, the unselected columns (i.e., half-selected column) do not see full bit-line amplification, and the internal SRAM cell node (i.e., NC or NT, as shown in FIG. 2 and further discussed below) is not quickly discharged to GND. These conditions limit the operating voltage of SRAM arrays.

To improve the stability margin of the SRAM cell and increase the operating margin, Sense Amplifier Assist (SAA) circuitry is added to the SRAM array. SAA features the addition of sense-amplifiers on every SRAM column to quickly discharge bit-lines during READ and unselected-WRITE operations (i.e., on half-selected columns). In general, adding SAA circuitry enables a wider operating voltage range for semiconductor devices. However, when a sense-amplifier is set on every bit-line in a subarray during READ and WRITE operations, every true or complement bit-line in the selected subarray transitions from $V_{DD}$ to ground GND and back to $V_{DD}$ during pre-charge. This mode of operation is a problem for the background art using SAA circuitry with SRAM architectures due to the power consumption penalty associated with these voltage transitions.

In some background art embedded applications, the additional power consumption that results from the above-discussed voltage transitions on the bit-lines is intolerable and thus, SAA cannot be implemented. However, without SAA, the SRAM may have a problem with meeting the voltage requirements of low power embedded applications.

FIG. 2 shows a memory cell of a background art SRAM. In particular, the memory cell of FIG. 2 includes a pair of cross-coupled inverters that together form a latch that retains the voltage levels on a pair of complimentary bit nodes BLC and BLT. A first access transistor extends between bit-line BLT and bit node NT, and a second access transistor extends between complimentary bit-line BLC and memory bit node NC.

To effect a WRITE operation for the memory cell in FIG. 2, the data to be written to the memory cell is driven onto complimentary bit-lines BLC and BLT and word line WL is asserted (e.g., driven high) to render the access transistors conducting. The respective voltages on bit-lines BLC and BLT are thereby conveyed to cross-coupled inverters. The word line signal WL is then de-asserted, disconnecting the complimentary bit-lines BLT, BLC from their respective bit nodes NT, NC. The cross-coupled inverters thereafter retain a voltage level representative of the written bit.

To effect a READ operation for the memory cell shown in FIG. 2, bit-lines BLC and BLT are pre-charged to some known level, typically to supply voltage $V_{DD}$. Word line signal WL is then asserted, so that cross-coupled inverters drive the latched voltage level onto complimentary bit-lines BLC and BLT. A sense amplifier detects the resulting logic level on the bit-lines.

However, yet another problem exists with this background art circuit configuration. During a read cycle, as the bit-lines BLC, BLT are discharged by the cell, the internal voltage on the cell nodes NC, NT can rise to a level that can reach the switch point of the cross-coupled inverter of the cell. This rise in voltage level on the internal nodes can disturb or distort the SRAM data.

FIG. 3 shows exemplary waveforms from the background art SRAM cell of FIG. 2. As shown in FIG. 3, the voltage level of the internal nodes NT, NC of FIG. 2 rise due to the affects of feedback in the cross-coupled inverter of the memory cell. This rise in voltage level results in the voltage levels on internal nodes NC, NT dropping from $V_{DD}$. Substantial variations in the voltage levels of the internal nodes NC, NT can eventually flip or disturb the state of the cell causing additional problems with this background art circuit configuration.

FIG. 4 is an exemplary graph illustrating the SRAM cell stability margins with technology migration/scaling to obtain smaller feature sizes. Increasing variations in threshold voltage ($V_t$) with technology scaling decreases the operating margin and stability ratios between the rising internal voltages on the cell nodes NC, NT and the switch-point of the cross-coupled inverter. This is indicated in FIG. 4 by the vanishing space between the cell switch-point and the read down level as feature size is reduced.

In addition, the discharge rate of the bit-line, as it is read, has a strong influence on the stability margin of the cell. For example, in long, heavily-loaded bit-lines, the voltage between the cell node and the inverter switch-point remains very small for a relatively long period as the bit-line is slowly discharged. Thus, long, heavily-loaded bit-lines are more sensitive to $V_t$ variations and therefore will have a smaller operating voltage range. Conversely, short, lightly-loaded bit-lines are quickly discharged by the cell, which in turn, rapidly discharges the cell node voltages to GND or $V_{SS}$.

In an attempt at improving the stability margin of a semiconductor cell and increase the operating margin, background art SRAM array designs have implemented short bit-line architectures. However, a problem with these short bit-line architectures is that they are not an effective means for improving stability in low-power technologies where the SRAM READ currents are very small. In particular, the number of SRAM cells on a bit-line would have to be in the range of 16 to 32 SRAM cells in order to observe a significant improvement in either stability or operating margin with the short bit-line architecture approach. Further, the SRAM array efficiency with short bit-line architectures is so poor that this method is often an unacceptable solution even in higher power embedded applications.

Therefore, it is clear that there is a need in the art for improvements in the performance of SRAM circuit architectures with SAA, particularly in low power applications.

SUMMARY OF THE INVENTION

The present invention provides a design structure comprising an apparatus to reduce the power in SRAM arrays featuring SAA circuitry. In particular, the present invention is a design structure that limits the implementation of the SAA circuitry to SRAM array blocks that do not meet the application voltage requirements.

In the present invention, memory arrays, subarrays, sections of subarrays or memory cells whose operating voltage do not require the SAA circuit functions are "masked" so that the sense amplifiers on the unselected (i.e., half-selected) bit-lines are not set. Further, in the present invention, the read data timing is kept the same between subarrays that have the SAA circuitry set/enabled and those that do not have the SAA circuitry set/enabled.

Furthermore, the present invention limits the voltage level or amount of time that internal nodes NT, NC rises. Thus, the stability margin of the cell improves. Moreover, the present invention is implemented with a minimal area penalty (i.e., <1%).

One embodiment of the invention is a sense amplifier circuit, comprising: a pair of p-channel transistors; a first pair of n-channel transistors; an n-channel transistor coupled to a common node between the first pair of n-channel transistors; a second pair of n-channel transistors with common drain and ground connections; a bit switch circuit; and a global bit-line circuit. Preferably, in this embodiment the pair of p-channel transistors are cross-coupled; the first pair of n-channel transistors are cross-coupled and the first pair of n-channel transistors and the pair of p-channel transistors are both further coupled to a complementary pair of bit-lines.

Further, preferably for this embodiment a gate of the n-channel transistor is configured to receive an input signal for setting the sense amplifier; and a gate of the first n-channel transistor of the second pair of n-channel transistors is configured to receive a mask input signal for masking unselected bit-lines. Furthermore, preferably for this embodiment a gate of the second n-channel transistor of the second pair of n-channel transistors is coupled to the bit switch; and the bit switch is coupled to a global bit-line circuit.

Moreover, preferably for the embodiment discussed above, the input signal for setting the sense amplifier circuit above is further coupled to a gate of the n-channel transistor is configured to receive an input signal for setting in a second sense amplifier circuit and the input signal for masking is further coupled to a gate of the first n-channel transistor of the second pair of n-channel transistors is configured to receive a mask input signal for masking unselected bit-lines in the second sense amplifier circuit. Further, the second sense amplifier circuit is in accordance to embodiment discussed above.

Another embodiment of the present invention is a method for reducing power in a memory array comprising: (1) coupling sense-amplifier assist circuitry to each column of the memory array; (2) setting the sense-amplifier assist circuitry on each column during both READ and WRITE cycles; (3) masking the sense-amplifier assist circuitry coupled to half-selected columns; (4) discharging bit-lines of the memory array to ground on both half-selected columns and fully-selected columns; (5) discharging internal cell nodes of the memory array; (6) performing a full WRITE-back of READ data to cells of the memory array disturbed during the READ cycles; and (7) maintaining READ data timing between the half-selected columns and fully-selected columns. In addition, the memory device is preferably a static random access memory (SRAM).

Moreover, the method of the present invention preferably further comprises: pre-charging global bit-lines to $V_{SS}$ during READ cycles; reinforcing the discharge of data lines during READ cycles via feedback from global bit-lines and preventing leakage to unselected global bit-lines. In particular, reinforcing the discharge is done when device TGT or TGC is turned on to drive global bit-lines GBLT or GBLC high. This turns on device TWT or TWC to aid in the discharge of the data line DLT or DLC. Preventing leakage to unselected global bit-lines in unselected subarrays occurs when device TD is active (i.e., as SUBSEL is low). This prevents the discharge of DLC or DLT so that DLC/DLT are kept at their $V_{DD}$ pre-charge state.

Yet another embodiment of the present invention is a method for testing a memory array comprising: providing a mask bit for each of a plurality of subarrays of the memory array; setting mask registers for sense amplifier assist circuitry coupled to each of the plurality of subarrays that pass a functional test; and disabling sense amplifier assist circuitry coupled to each of the plurality of subarrays failing the functional test.

Preferably, the above embodiment further comprises functional tests that at least include testing to a low-voltage corner. Moreover, in the above-discussed embodiment, disabling sense amplifier circuitry further comprises blowing a fuse for each subarray that does not pass the functional tests.

BRIEF DESCRIPTION OF THE DRAWINGS

The present invention can be described in greater detail with the aid of the following drawings.

DETAILED DESCRIPTION OF THE PREFERRED EMBODIMENT

The present invention is an apparatus and method for improving the operating voltage range and stability margin of SRAM arrays. As semiconductor technology scales down to smaller feature sizes, SRAM cells are becoming more sensitive to lower operating voltages. For example, when a cell is read, the data in the SRAM cell can be disturbed or distorted.

Figure 5:
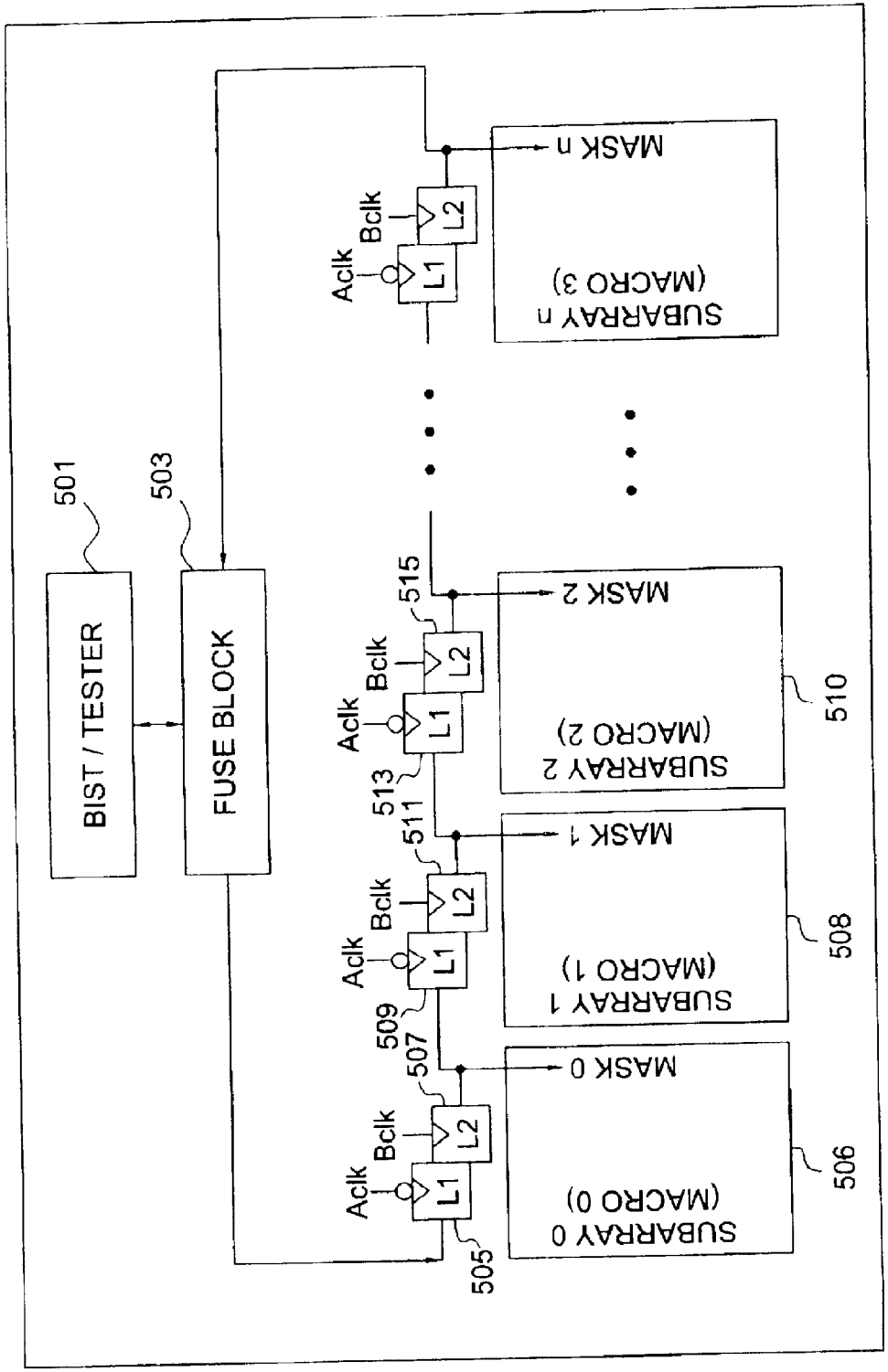
FIG. 5 is an exemplary block diagram of the present invention.

FIG. 5 shows an exemplary block diagram of the SSA circuitry 500 of the present invention. In particular, FIG. 5 shows each subarray, bank or macro 506, 508, 510 of the SRAM apparatus has a mask-bit register 507, 511, 515. During functional tests, the subarrays, banks or macros are tested to a low-voltage corner by a BIST/TESTER 501. Subarrays with single-cell failures that go beyond redundancy repair capability have their mask registers set to ground (GND). Single cell failures induced in the field can be easily repaired using this circuitry. Setting the mask registers 507, 511, 515 to GND activates SAA circuitry 500 of the present invention. The SAA circuitry 500 of the present invention is further discussed below.

In the present invention, distortion or disturbance of SRAM data due to READ-access is decreased by reducing the amount of charge injection from the $V_{DD}$-pre-charged bit-Line BL to the low node of the cell. The quicker the BL can be discharged, the less likely an unstable cell will lose data when disturbed. Unstable cells are especially vulnerable during the half-selected (i.e., unselected operations with idle columns during WRITE or READ operations).

In contrast to the background art, the SAA feature of the present invention provides full BL amplification to both fully-selected and unselected columns. Full BL amplification improves the discharge rate of the low-node of the cell and provides data recovery by writing back the original data prior to the READ-access disturb.

Figure 6:
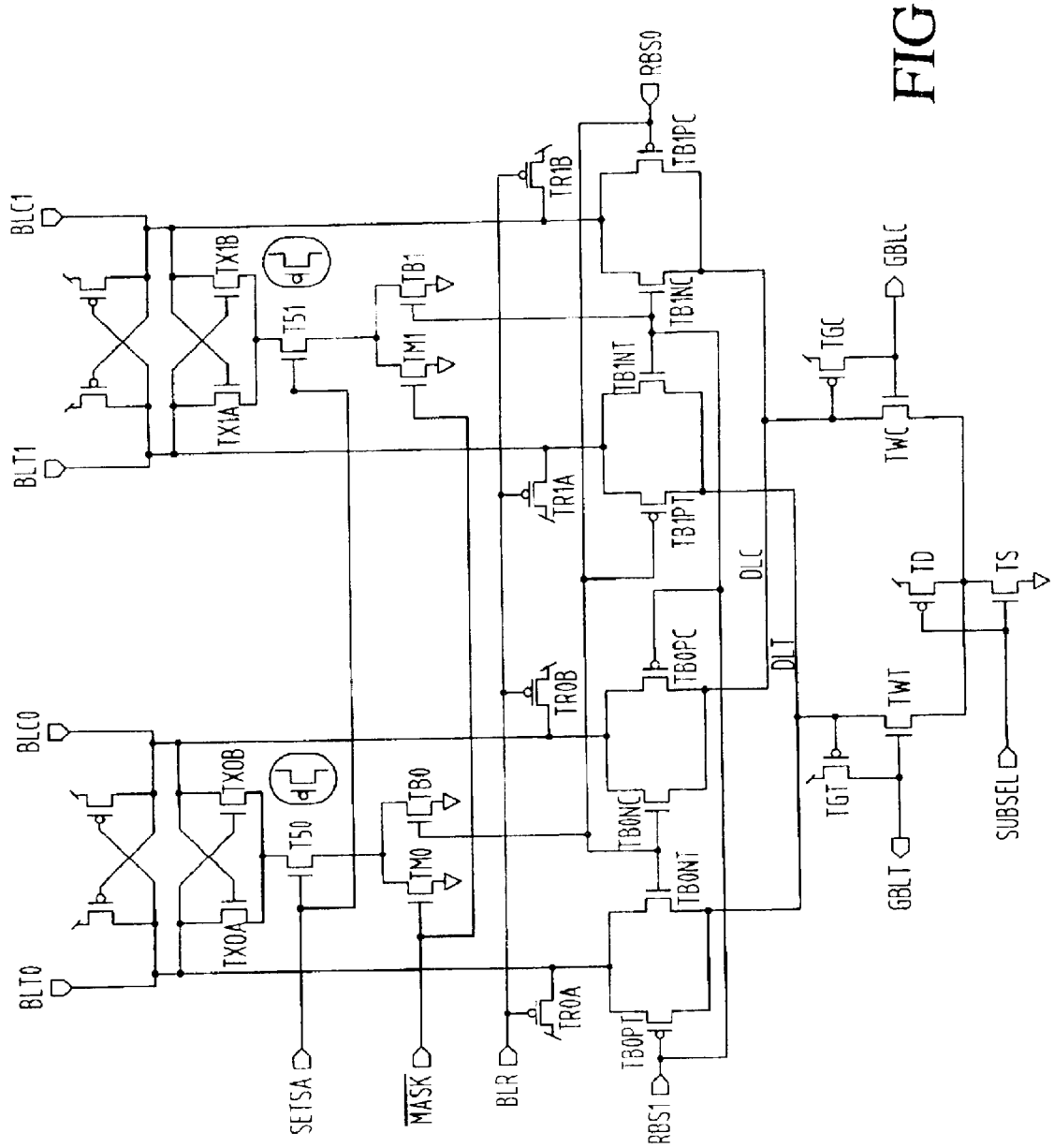
FIG. 6 is an exemplary circuit schematic diagram of the present invention.

FIG. 6 shows an exemplary schematic circuit diagram of SSA circuit 500 and features an SAA circuitry integrated in each subarray column. In particular, with the present invention if bit-Lines BLC0, BLT0 are written to during a write operation, bit-Lines BLC1, BLT1 are concurrently sensed and fully amplified.

Figure 1:
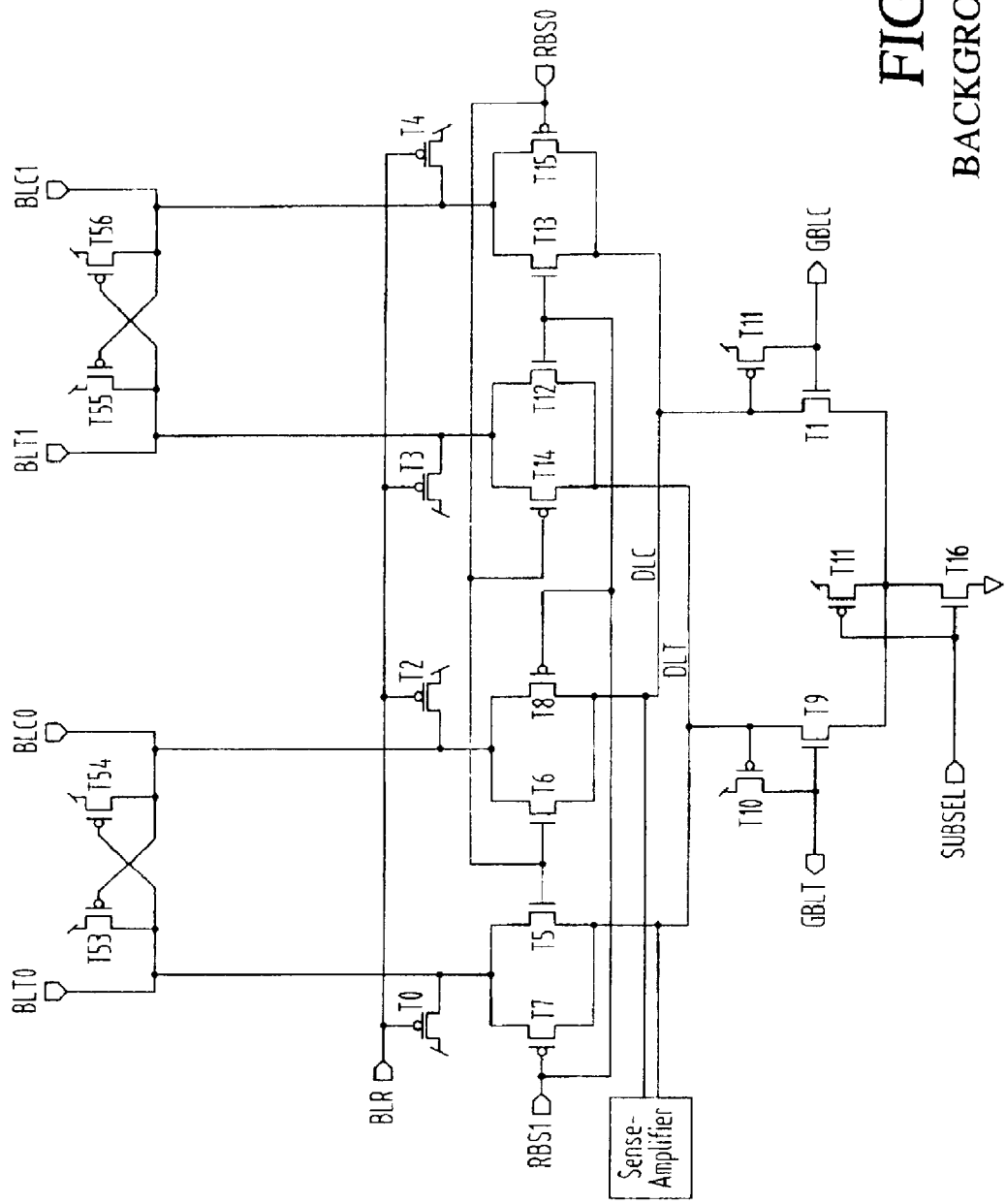
FIG. 1 is an exemplary block diagram of a background art implementation of an SRAM array.
Figure 2:
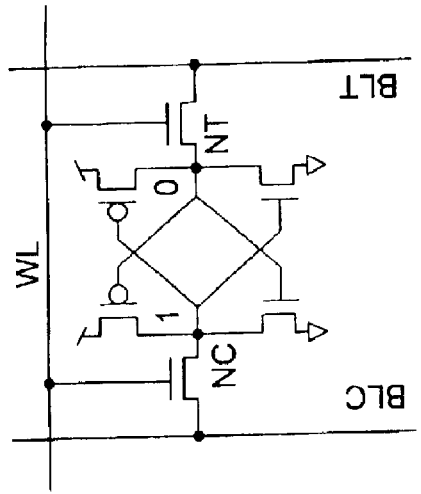
FIG. 2 is an exemplary circuit schematic diagram of a background art SRAM cell.
Figure 3:
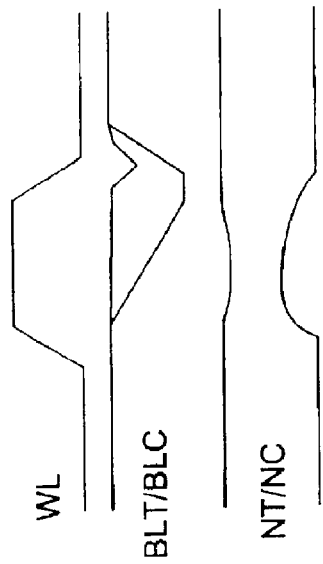
FIG. 3 is an exemplary waveform diagram illustrating the READ operation of the background art SRAM cell of FIG. 2.
Figure 4:
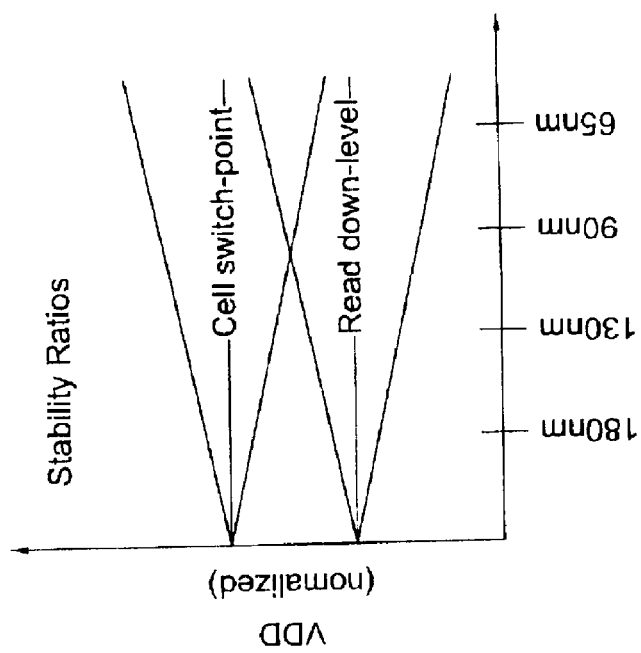
FIG. 4 is an exemplary graph illustrating SRAM cell stability margins with technology migration/scaling.

In contrast to the background art schematic of FIG. 1, FIG. 6 shows the present invention comprises additional SAA transistors (e.g., TX0A, TX0B, T50, TM0, TB0) in each column of the SRAM array. As shown in FIG. 6, the sense-amplifiers are set on every bit-line on both READ and WRITE cycles. Thus, the present invention provides a means for quickly discharging half-selected bit-lines during READ and WRITE operations.

In the present invention, a cross-coupled NFET SAA is included in every bit-line pair. That is, as shown in FIG. 6, a bitline pair BLT0, BLC0, has NFET SAA circuitry comprising TX0A, TX0B, T50, TM0, TB0.

Further, when a signal /MASK, as shown in FIG. 6, is set to $V_{DD}$, every bit-line in the subarray has SM circuitry that is set by a global set signal SETSA. Setting the signal /MASK, as discussed above, is defined as SM mode.

In addition, both fully-selected bit-lines and half-selected bit-lines experience a full voltage discharge to GND after the sense-amplifiers are set in the SM mode. In the SAA mode, the apparatus and method of the present invention provides a full WRITE-back of the read data to those cells that are disturbed during the READ operation.

Further, in the present invention, bit-lines that are half-selected during both READ and WRITE cycles realize an improvement in discharge rate. That is, with the apparatus and method of the present invention, bit-lines are quickly discharged by the cell, which in turn, rapidly discharges the internal cell node voltages (e.g., NT or NC) to GND or $V_{SS}$. Further, NFETs TM0, TM1 of the SM circuits 500 shown in FIG. 6 provide a GND path to the sense-amplifier for all bit-lines and thus, one bit-line in each pair is fully discharged to GND.

Furthermore, the operation mode is enabled by NFETS TB0, TB1, which are controlled by the selection of the bit switch RBS0, RBS1. During the operation mode, the SM circuitry is not required on half-selected bit-lines. In addition, the signal /MASK, as shown in FIG. 6 is set to GND or $V_{SS}$. Moreover, in the operation mode, the sense-amplifier sets only one of those bit-lines that are selected. Thus, in the present invention, the sense-amplifier on half-selected bit-lines does not have a path to GND, when the signal SETSA is enabled. In the operation mode, the small signal swing on the bit-lines is preserved and the power penalty of the background art is reduced.

In another embodiment of the present invention, PFET set devices are included to further improve the power dissipation characteristics of the apparatus. The PFET set devices have a cut-off at a P-$V_t$ above $V_{SS}$ and thus prevent a full bit-line discharge. In addition, the circled PFET devices adjacent to T50, T51 show yet another alternative embodiment of the present invention. That is, NFET devices T50, T51 can be replaced with the indicated PFET devices.

In particular, in this embodiment, the global bit-lines GBLC, GBLT, shown in FIG. 6, are pre-charged to $V_{SS}$ and driven high during read cycles by PFETs TGT, TGC. NFET devices TWC, TWT are used to reinforce the discharge of the data line during a READ operation using the feedback GBLC, GBLT driver devices. PFET device TD prevents leakage to global bit-lines in the unselected subarrays.

Fluctuations that affect cell stability margin are generally random in nature. The present invention further includes a masking function that can be enabled to mitigate the increase in power resulting from generating a full signal swing on all subarray columns. Signal amplification on half-selected Bit-Lines can be inhibited by disabling the MASK signals at the subarray level, as shown in FIG. 5. As shown in FIG. 6, during the masking operation, bit-switch signals RBS0 and RBS1 enable the sense-amplifier activation only on the selected column.

Using the exemplary schematic circuit diagram of FIG. 6 as an example, a 400 mV improvement in operating voltage is seen in simulations using a 5 sigma unbalanced cell. The area overhead of the SAA circuitry 500 is approximately 1.2% (i.e., in a subarray with 128 cells/Bit-line). Since the implementation can be made using a hierarchical bit-line structure, the power penalty of switching bit-lines during READ and WRITE operations is relatively small.

Figure 7A:
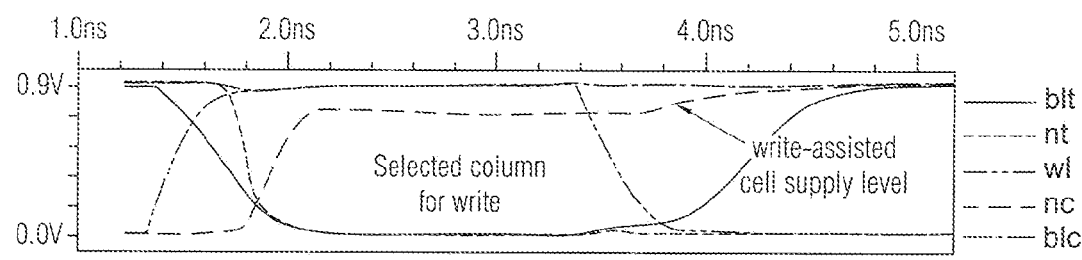
FIG. 7A-FIG. 7C are exemplary simulation results demonstrating the performance of the present invention.
Figure 7B:
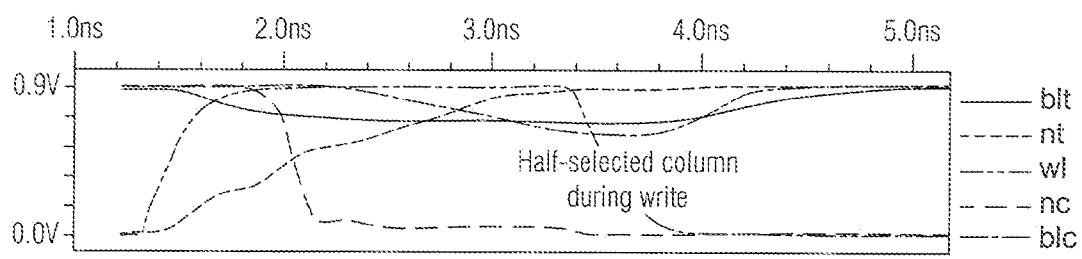
Figure 7C:
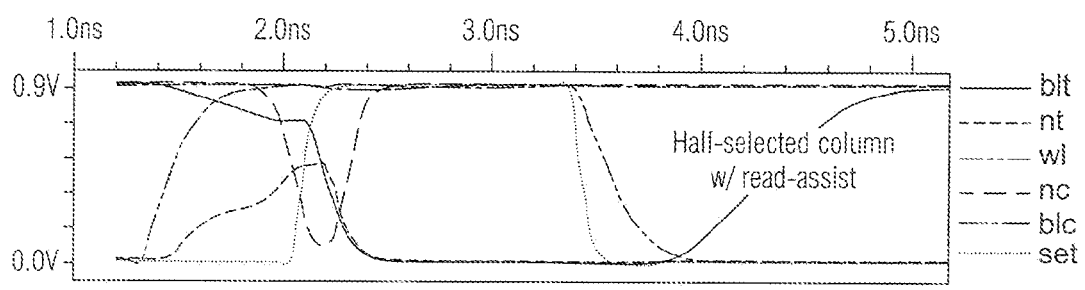

Simulation results of the read assist feature are shown in FIG. 7A-FIG. 7C. FIG. 7A shows the voltage waveforms of write Bit Line BLT and cell nodes NC, NT for the write selected column. FIG. 7B shows data corruption of an unstable cell for the half-selected column during the write operation. FIG. 7C shows the half-selected column with the assist feature invoked. The benefits of the read-assist operation are observed when the SA set signal amplifies BLT. This in turn recovers the data in the cell by writing-back its original state.

Alternatively, in the above embodiments of the present invention, the selection/setting of the SAA circuitry 500 can be optional. In fact, by preventing the selection/setting of the SAA, the flow-through access time of each cell can be determined.

Figure 8:
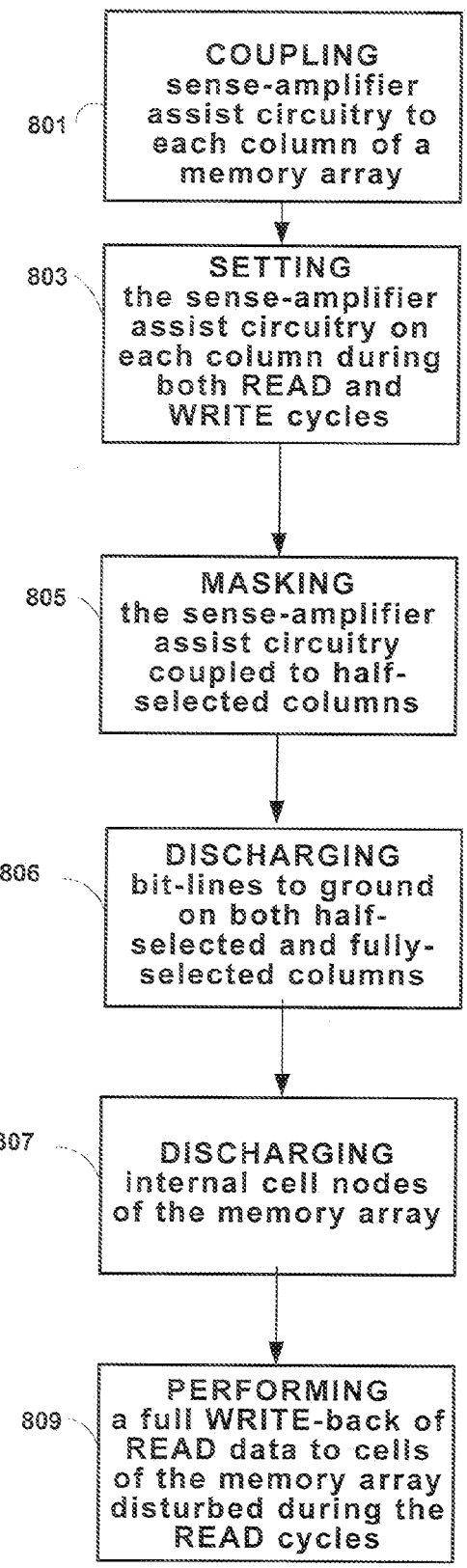
FIG. 8 is an exemplary flow diagram of a method of the present invention.

Another embodiment of the invention is shown in the method flow diagram of FIG. 8. In particular, step 801 of FIG. 8 is directed to coupling sense-amplifier assist circuitry to each column of a memory array. Step 803 of FIG. 8 is setting the sense-amplifier assist circuitry on each column during both READ and WRITE cycles. Masking of the sense-amplifier assist circuitry that is coupled to half-selected columns is performed in step 805. Discharging bit-lines to ground on both half-selected and fully-selected columns occurs in Step 806. Step 807 of FIG. 8 is discharging the internal cell nodes of the memory array. Performing a full WRITE-back of READ data to cells of the memory array disturbed during READ cycles.

Figure 9:
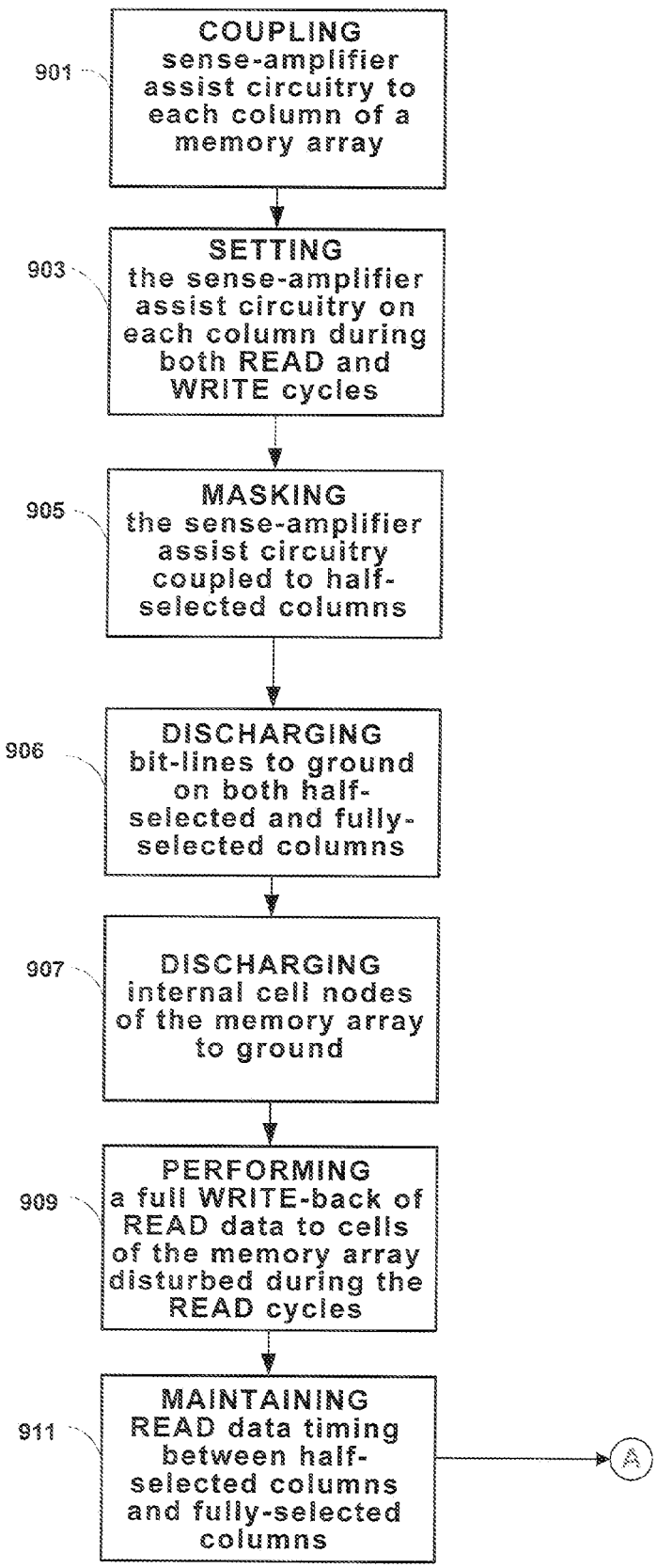
FIG. 9 is an exemplary flow diagram of an alternative to the method of the present invention.

Alternatively, the above embodiment may further comprise the method shown in the flow diagram of FIG. 9. In particular, step 901 of FIG. 9 is directed to coupling sense-amplifier assist circuitry to each column of a memory array. Step 903 of FIG. 9 is setting the sense-amplifier assist circuitry on each column during both READ and WRITE cycles. Masking of the sense-amplifier assist circuitry that is coupled to half-selected columns is performed in step 905. Discharging bit-lines to ground on both half-selected and fully-selected columns occurs in Step 906. In step 907, the internal cells nodes of the memory array are discharged to ground. Performing a full WRITE-back of READ data to cells of the memory array disturbed during READ cycles occurs in step 909. Step 911 is directed to maintaining READ data timing between half-selected columns and fully-selected columns.

Figure 10:
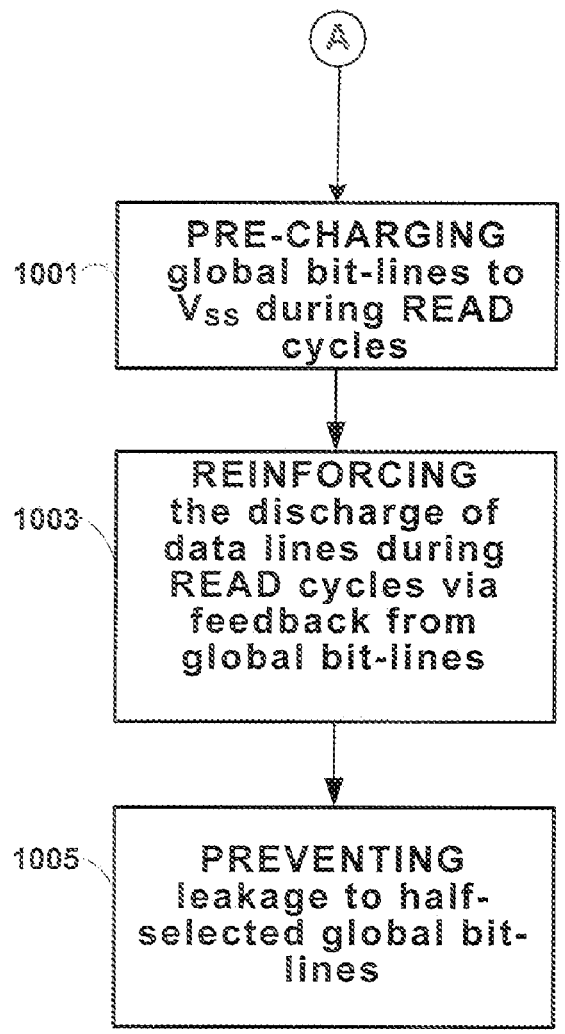
FIG. 10 is an exemplary flow diagram of yet another alternative to the method of the present invention.

Preferably, the method of the present invention further comprises the method steps of the flow diagram shown in FIG. 10. In particular, as continued from FIG. 9 (i.e., see reference "A" of FIG. 9), step 1001 involves pre-charging global bit-lines to Vss during READ cycles. Reinforcing the discharge of data lines during READ cycles via feedback from global bit-lines occurs in step 1003. In particular, the step of reinforcing is performed at least when device TGT or TBC is turned on to drive global bit-lines GBLT, GBLC to a high voltage level (e.g., but not limited to $V_{DD}$). This further turns on device TWT or TWC to aid in the discharge of data line DLT or DLC.

Further, Step 1005 of FIG. 10 is preventing leakage to half-selected global bit-lines. This step of preventing is realized for unselected global bit-lines in unselected subarrays, where device TD is active (i.e., SUBSEL is low). This further prevents the discharge of DLC or DLT so that both DLC and DLT are kept at their $V_{DD}$ pre-charge state.

Figure 11:
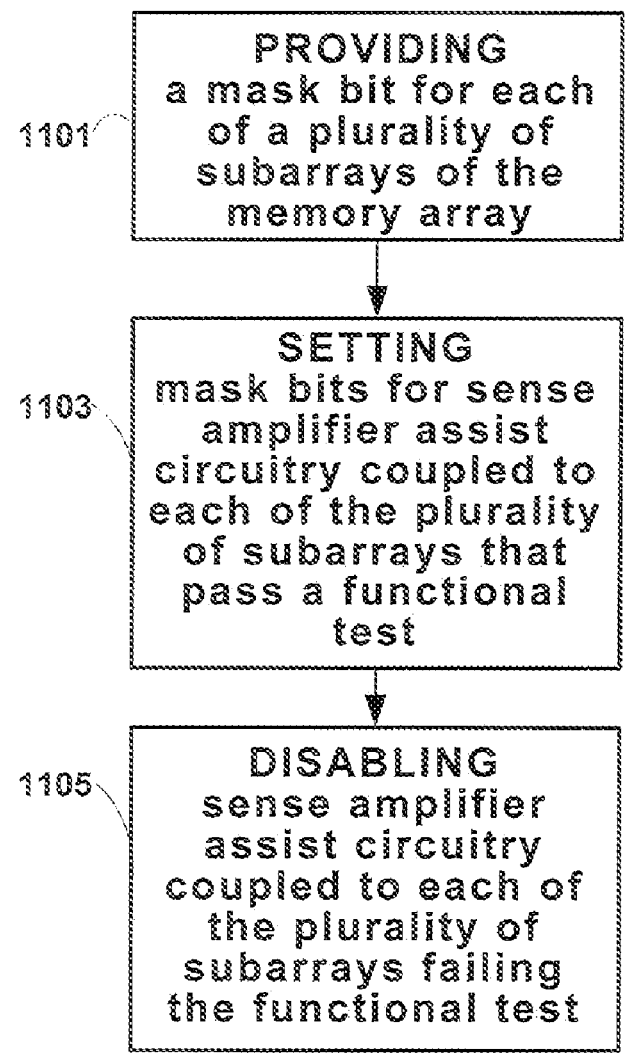
FIG. 11 is an exemplary flow diagram of yet another embodiment of the present invention directed toward a method for testing a memory array.

FIG. 11 is yet another embodiment of the present invention. In particular, FIG. 11 discloses a method for testing a memory array as shown in the block diagram of FIG. 5. In particular, step 1101 of FIG. 11 is providing a mask bits for each of a plurality of subarrays of the memory array. Step 1103 involves setting mask bits for sense amplifier assist circuitry coupled to each of the plurality of subarrays that pass a functional test. Disabling sense amplifier assist circuitry coupled to each of the plurality of subarrays failing the functional test occurs in step 1105.

Preferably the above method further comprises functional tests that at least includes testing to a low-voltage corner. Moreover, the above embodiment further comprises disabling sense amplifier circuitry further comprises blowing a fuse for each subarray that does not pass the functional tests.

Figure 12:
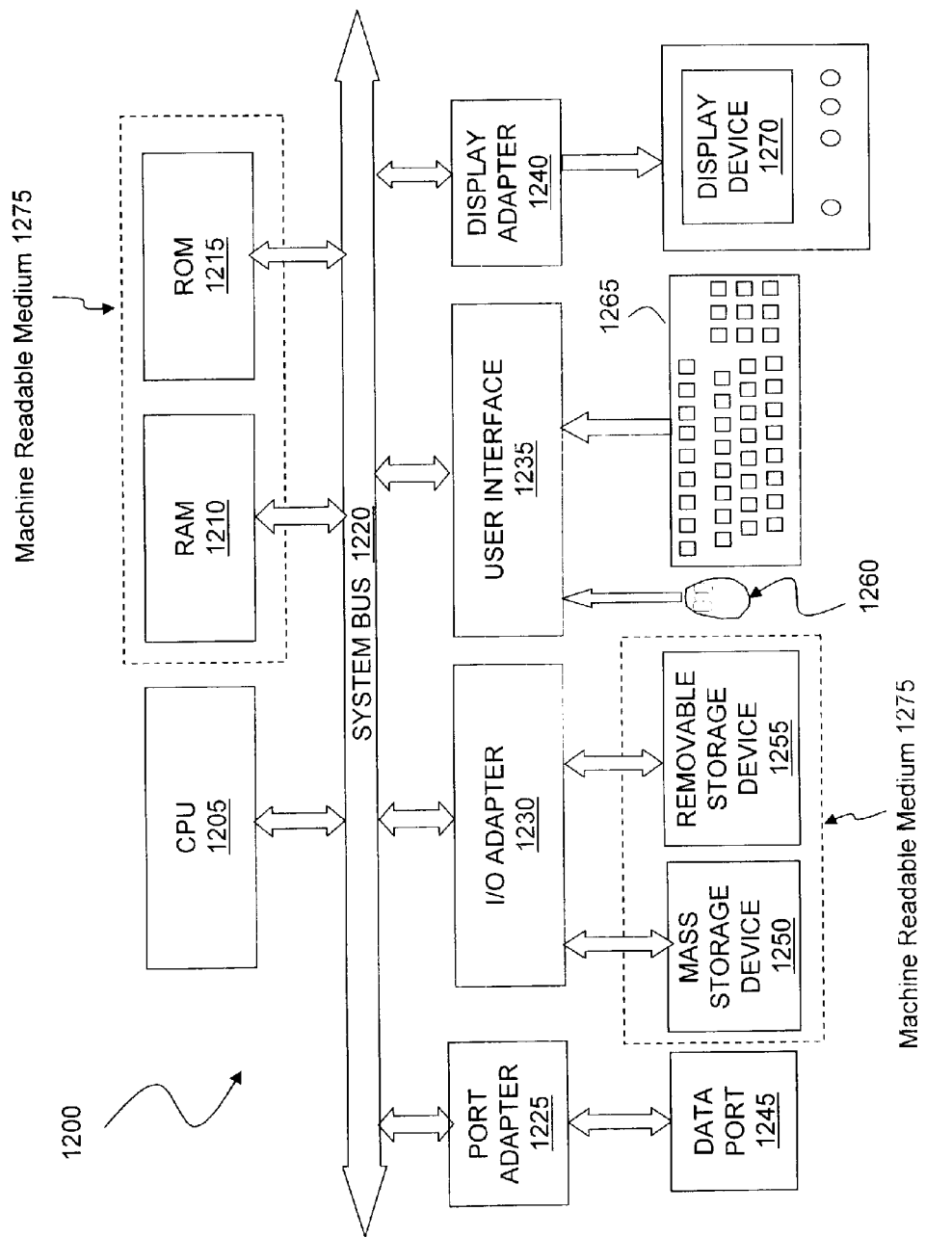
FIG. 12 is an example computer system of a general-purpose computer system and computer readable medium for practicing the present invention.

FIG. 12 illustrates a block diagram of a general-purpose computer system which can be used to implement the system and method described herein. The system and method may be coded as a set of instructions on removable or hard media for use by general-purpose computer. FIG. 12 is a schematic block diagram of a general-purpose computer for practicing the present invention and includes computer system 1200, which has at least one microprocessor or central processing unit (CPU) 1205. CPU 1205 is interconnected via a system bus 1220 to machine readable media 1275, which includes, for example, a random access memory (RAM) 1210, a read-only memory (ROM) 1215, a removable and/or program storage device 1255 and a mass data and/or program storage device 1250. An input/output (I/O) adapter 1230 connects mass storage device 1250 and removable storage device 1255 to system bus 1220. A user interface 1235 connects a keyboard 1265 and a mouse 1260 to system bus 1220, and a port adapter 1225 connects a data port 1245 to system bus 1220 and a display adapter 1240 connect a display device 1270. ROM 1215 contains the basic operating system for computer system 1200. Examples of removable data and/or program storage device 1255 include magnetic media such as floppy drives, tape drives, portable flash drives, zip drives, and optical media such as CD ROM or DVD drives. Examples of mass data and/or program storage device 1250 include hard disk drives and non-volatile memory such as flash memory. In addition to keyboard 1265 and mouse 1260, other user input devices such as trackballs, writing tablets, pressure pads, microphones, light pens and position-sensing screen displays may be connected to user interface 1235. Examples of display device 1270 include cathode-ray tubes (CRT) and liquid crystal displays (LCD).

A machine readable computer program may be created by one of skill in the art and stored in computer system 1200 or a data and/or any one or more of machine readable medium 1275 to simplify the practicing of this invention. In operation, information for the computer program created to run the present invention is loaded on the appropriate removable data and/or program storage device 1255, fed through data port 1245 or entered using keyboard 1265. A user controls the program by manipulating functions performed by the computer program and providing other data inputs via any of the above mentioned data input means. Display device 1270 provides a means for the user to accurately control the computer program and perform the desired tasks described herein.

Figure 13:
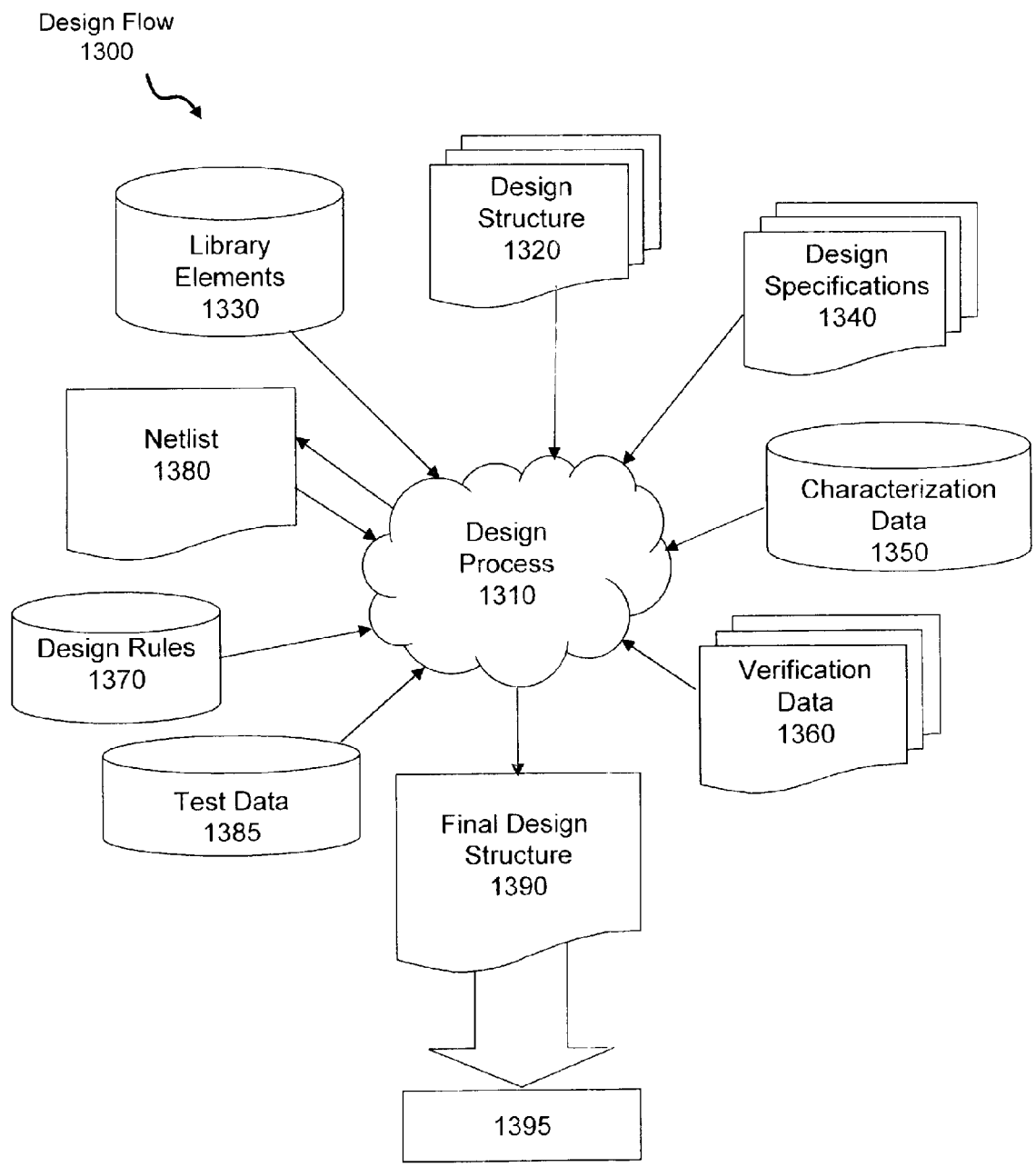
FIG. 13 is an example design flow process of instantiating a design structure comprising an embodiment of the present invention into an IC design to create a final design structure.

FIG. 13 shows a block diagram of an example design flow 1300. Design flow 1300 may vary depending on the type of IC being designed. For example, a design flow 1300 for building an application specific IC (ASIC) will differ from a design flow 1300 for designing a standard component. Design structure 1320 is an input to a design process 1310 and may come from an IP provider, a core developer, or other design company. Design structure 1320 comprises SSA circuitry 500 in the form of schematics or HDL, a hardware-description language, (e.g., Verilog, VHDL, C, etc.). Design structure 1320 may be on one or more of machine readable medium 1275 as shown in FIG. 12. For example, design structure 1320 may be a text file or a graphical representation of SSA circuitry 500. Design process 1310 synthesizes (or translates) SSA circuitry 500 into a netlist 1380, where netlist 1380 is, for example, a list of transistors, subarrays, macros, etc. and describes the connections to other elements and circuits in an integrated circuit design and recorded on at least one of machine readable medium 1275.

Design process 1310 includes using a variety of inputs; for example, inputs from library elements 1330 which may house a set of commonly used elements, circuits, and devices, including models, layouts, and symbolic representations, for a given manufacturing technology (e.g. different technology nodes, 32 nm, 45 nm, 90 nm, etc.), design specifications 1340, characterization data 1350, verification data 1360, design rules 1370, and test data files 1385, which may include test patterns and other testing information. Design process 1310 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1310 without deviating from the scope and spirit of the invention.

Ultimately design process 1310 translates SSA circuitry 500, along with the rest of the integrated circuit design (if applicable), into a final design structure 1390 (e.g., information stored in a GDS storage medium). Final design structure 1390 may comprise information such as, for example, test data files, design content files, manufacturing data, layout parameters, wires, levels of metal, vias, shapes, test data, data for routing through the manufacturing line, and any other data required by a semiconductor manufacturer to produce SSA circuitry 500. Final design structure 1390 may then proceed to a stage 1395 of design flow 1300; where stage 1395 is, for example, where final design structure 1390: proceeds to tape-out, is released to manufacturing, is sent to another design house or is sent back to the customer.

The foregoing description of the invention illustrates and describes the present invention. Additionally, the disclosure shows and describes only the preferred embodiments of the invention, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described herein above are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein. Also, it is intended that the appended claims be construed to include alternative embodiments.

What is claimed is:

1. A design structure instantiated in a machine readable medium for designing or manufacturing a sense amplifier circuit, the design structure, comprising:
    a pair of p-channel transistors;
    a first pair of n-channel transistors;
    an n-channel transistor coupled to a common node between the first pair of n-channel transistors;
    a second pair of n-channel transistors with common drain and ground connections;
    a bit switch circuit; and
    a global bit-line circuit,
    wherein the pair of p-channel transistors are cross-coupled,
    wherein the first pair of n-channel transistors are cross-coupled and the first pair of n-channel transistors and the pair of p-channel transistors are both further coupled to a complementary pair of bit-lines,
    wherein a gate of the n-channel transistor is configured to receive an input signal for setting the sense amplifier,
    wherein a gate of the first n-channel transistor of the second pair of n-channel transistors is configured to receive a mask input signal for masking unselected bit-lines,
    wherein a gate of the second n-channel transistor of the second pair of n-channel transistors is coupled to the bit switch,
    wherein the bit switch is coupled to a global bit-line circuit,
    wherein the design structure comprises a netlist that describes the sense amplifier circuit,
    and wherein the mask input signal is set to VDD, the bit-lines in a subarray is set by a global set signal.

2. The design structure of claim 1, wherein the input signal for setting is further coupled to a gate of the n-channel transistor configured to receive an input signal for setting in a second sense amplifier circuit and the input signal for masking is further coupled to a gate of the first n-channel transistor of the second pair of n-channel transistors is configured to receive a mask input signal for masking unselected bit-lines in the second sense amplifier circuit, wherein the second sense amplifier circuit is in accordance to claim 1.

3. The-flial design structure of claim 1, wherein the design structure resides on a GDS storage medium.

4. The final design structure of claim 1, wherein the design structure comprises a plurality of test data files.

* * * * *